(12) United States Patent
Yotsuji (10) Patent No.: US 11,190,222 B2
(45) Date of Patent: Nov. 30, 2021

(54) DATA SLICER AND RECEIVER

(71) Applicant: LAPIS Semiconductor Co., Ltd., Yokohama (JP)

(72) Inventor: Tetsuaki Yotsuji, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/751,833

(22) Filed: Jan. 24, 2020

(65) Prior Publication Data
US 2020/0252089 A1 Aug. 6, 2020

(30) Foreign Application Priority Data

Jan. 31, 2019 (JP) ................. JP2019-15127

(51) Int. Cl.
| | | |
|---|---|---|
| *H04B 1/00* | (2006.01) | |
| *H03F 3/45* | (2006.01) | |
| *H04B 1/06* | (2006.01) | |
| *H04L 27/06* | (2006.01) | |
| *H03K 3/356* | (2006.01) | |

(52) U.S. Cl.
CPC ....... *H04B 1/0007* (2013.01); *H03F 3/45269* (2013.01); *H03K 3/356104* (2013.01); *H04B 1/06* (2013.01); *H04L 27/06* (2013.01); *H03F 2200/102* (2013.01)

(58) Field of Classification Search
CPC .................................................... H04B 1/0007
USPC .......................................................... 375/320
See application file for complete search history.

(56) References Cited

U.S. PATENT DOCUMENTS

| | | | | |
|---|---|---|---|---|
| 5,530,767 A * | 6/1996 | Yoshida | ............... | H03G 3/3052 379/395 |
| 6,385,261 B1* | 5/2002 | Tsuji | ........................ | H04B 1/10 375/254 |
| 2003/0128055 A1* | 7/2003 | Lin | ......................... | H03F 3/345 327/57 |
| 2011/0205783 A1* | 8/2011 | Murooka | ............. | G11C 13/004 365/148 |

FOREIGN PATENT DOCUMENTS

| | | |
|---|---|---|
| JP | 2001358780 A | 12/2001 |
| JP | 3655805 B2 | 6/2005 |

* cited by examiner

*Primary Examiner* — Lihong Yu
(74) *Attorney, Agent, or Firm* — Rabin & Berdo, P.C.

(57) ABSTRACT

A data slicer for converting an envelope signal of an amplitude-modulated wave into a binary signal, comprises: an average level generation circuit configured to generate an average level of the envelope signal by averaging the envelope signal per time; a fixed voltage value generation circuit configured to generate a fixed voltage value; a reference level generation circuit configured to generate a reference level in accordance with the fixed voltage value and the average level of the envelope signal; and a comparison circuit configured to compare a signal level of the envelope signal with the reference level to output a result of the comparison as the binary signal.

7 Claims, 12 Drawing Sheets

REFERENCE LEVEL OF
COMPARATIVE EXAMPLE
ENVELOPE

FIG.15B

REFERENCE LEVEL OF
SECOND EMBODIMENT

ENVELOPE

DATA SLICER AND RECEIVER

BACKGROUND

1. Technical Field

The present invention relates to a data slicer and a receiver.

2. Description of the Related Art

In recent years, a communication system using RFID (Radio Frequency Identification) has been used in the field of commodity management and the like. In an RFID communication system, contactless short-range wireless communication using radio waves is performed between an RFID tag that holds information and a reader/writer that reads and writes the information.

In the RFID communication system, for example, a signal whose amplitude is modulated by ASK (Amplitude Shift Keying) is transmitted from the reader/writer to the RFID tag. The RFID tag receives and demodulates the amplitude-modulated signal. At that time, the RFID tag first performs envelope detection to the received signal. Then, the RFID tag converts the envelope into a waveform of a binary level (that is, H level or L level) by comparing a level of an envelope obtained by the envelope detection with a reference level. In the RFID communication, upon detecting a first L level section appearing in the preamble of the received signal, the RFID tag starts reception. After that, based on a length of the H level section between one L level section and the next L level section in the subsequent data section, information data "0" or "1" is obtained.

As a data slicer that converts an envelope into a waveform of the binary level, a data slicer that uses as a reference level a value obtained by smoothing an envelope with a low-pass filter has been proposed in Japanese Patent No. 3655805. In addition, another data slicer in which a peak level and a bottom level of an envelope are acquired and an intermediate level thereof is used as a reference level has been proposed in Japanese Laid-Open Patent Publication No. 2001-358780.

In RFID communication using a so-called passive RFID tag, it is necessary to supply power for operating the RFID tag by radio waves from a reader/writer. Therefore, in such RFID communication, it is necessary to lengthen the H level section of a signal transmitted from the reader/writer to the RFID tag (that is, it is necessary to increase the H level duty of the signal).

In the data slicer disclosed in such Japanese Patent No. 3655805 as mentioned above, the level obtained by time-averaging (that is, averaging per time) the envelope by means of the low-pass filter is the reference level. For this reason, when the H level section is relatively long, the reference level is close to the peak of the envelope. When the envelope fluctuates due to influence of noise or the like, the signal level falls below the reference level in a section that should be originally determined to be the H level, and the L level is erroneously output for each time. As a result, there is a possibility that chattering due to the extra toggle may occur. In addition, when a short H level section is included in the envelope, there is a possibility that the level does not reach the reference level or barely reaches. Thus, there is a high risk that the H level will fail to be output or that the H level will be output, so that it will become too short to be captured by the circuit in the subsequent stage.

In the RFID communication, it is necessary to determine the first L level appearing in the preamble. Therefore, there has been a problem that it is difficult to apply, to the RFID communication, the data slicer which requires acquisition of the peak level and the bottom level of the envelope to generate the reference level, as described in Japanese Laid-Open Patent Publication No. 2001-358780 as mentioned above.

SUMMARY

In view of the aforementioned problems, it is an object of the present invention to provide a data slicer that can binarize an envelope signal with high accuracy.

According to the present invention, a data slicer is provided for converting an envelope signal of an amplitude-modulated wave into a binary signal, and comprises: an average level generation circuit configured to generate an average level of said envelope signal by averaging said envelope signal per time; a fixed voltage value generation circuit configured to generate a fixed voltage value; a reference level generation circuit configured to generate a reference level in accordance with said fixed voltage value and said average level of said envelope signal; and a comparison circuit configured to compare a signal level of said envelope signal with said reference level to output a result of the comparison as the binary signal.

According to the present invention, a receiver comprises: an antenna unit configured to receive a wireless signal whose amplitude is modulated; a detector configured to perform envelope detection to the received wireless signal to generate an envelope signal; a data slicer configured to convert said envelope signal into a binary signal; and a demodulator configured to demodulate said wireless signal in accordance with said binary signal, wherein said data slicer includes: an average level generation circuit configured to generate an average level of said envelope signal by averaging said envelope signal per time; a fixed voltage value generation circuit configured to generate a fixed voltage value; a reference level generation circuit configured to generate a reference level in accordance with said fixed voltage value and said average level of said envelope signal; and a comparison circuit configured to compare a signal level of said envelope signal with said reference level to output a result of the comparison as the binary signal.

According to the data slicer of the present invention, it is possible to binarize an envelope signal with high accuracy.

DETAILED DESCRIPTION

Preferred embodiments of the present invention will now be described below in detail with reference to the drawings. In the following description of each of the embodiments and the accompanying drawings, substantially the same or equivalent parts are denoted by the same reference numerals.

First Embodiment

A receiver according to a first embodiment is located in an RFID (Radio Frequency Identification) tag which transmits and receives ID information using close range wireless communication. Specifically, the receiver of the first embodiment is located in a so-called passive RFID tag that operates by receiving power supply by radio waves for wireless communication from an RFID reader/writer (not shown). In the first embodiment, an ASK (Amplitude Shift Keying) modulated RF signal (that is, an amplitude-modulated wave) is transmitted from the reader/writer to the RFID tag. The receiver receives and demodulates the modulated RF signal.

Figure 1:
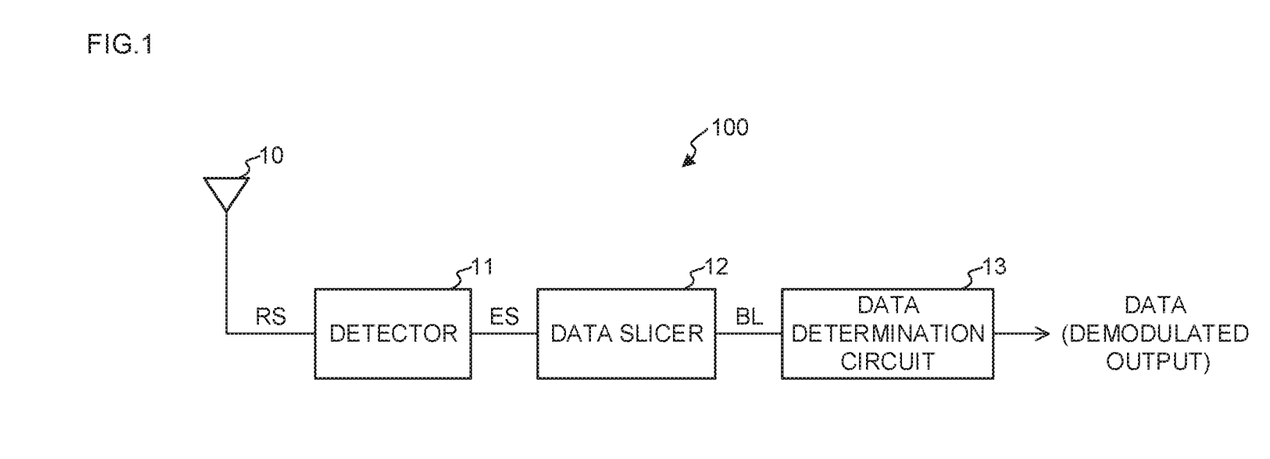
FIG. 1 is a block diagram illustrating a configuration of a receiver according to a first embodiment of the present invention.

FIG. 1 is a block diagram illustrating a part of a configuration of a receiver 100 according to the first embodiment. The receiver 100 includes an antenna 10, a detector 11, a data slicer 12, and a data determination circuit 13.

The antenna 10 receives an RF signal transmitted from the reader/writer and supplies the received RF signal (hereinafter referred to as a received signal RS) to the detector 11.

Figure 2A:
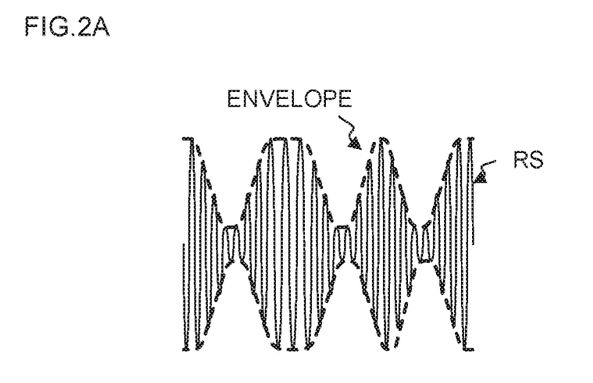
FIG. 2A is a diagram schematically showing envelope detection.

The detector 11 performs envelope detection to the received signal RS. FIG. 2A is a diagram schematically illustrating the envelope detection. By the envelope detection of the detector 11, an envelope waveform as shown by a broken line is obtained from the received signal RS shown by a solid line. The detector 11 supplies an envelope signal ES representing the amplitude of the envelope waveform to the data slicer 12.

The data slicer 12 is a circuit that executes data slice processing for converting the envelope signal ES into a binary signal waveform (hereinafter referred to as a binary level waveform) composed of "H" and "L". The binary level waveform generated from the data slicer 12 is supplied as a binary level signal BL to the data determination circuit 13 provided at the subsequent stage of the data slicer 12. The data determination circuit 13 converts the binary level signal BL to "0" or "1" data. The demodulator 13 demodulates the received signal RS in accordance with the binary signal output from the data slicer 12. As a result, the received signal RS is demodulated.

Figure 2B:
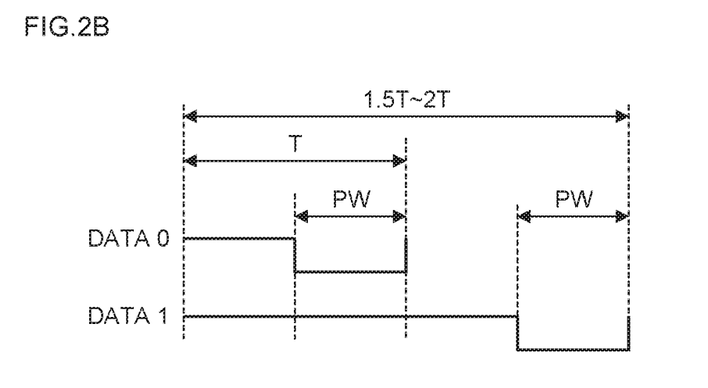
FIG. 2B is a diagram showing correspondence relationships between binary level waveforms and data values.

FIG. 2B is a diagram illustrating correspondence relationships between binary level waveforms generated by the data slicer 12 and data "0" and "1". For example, the data "0" has a period length T, and is composed of an H level period having a length approximately half of the period length T and an L level period PW following the H level period. On the other hand, the data "1" has a longer period than the data "0" (for example, 1.5×T or more and 2.0×T or less) and has a relatively long H level period (for example, three times the period PW) and the following L level period PW. Accordingly, since the data slicer 12 generates the binary level waveform as mentioned above and the data determination circuit 13 determines the length of the H level period, data "0" or "1" can be obtained.

Figure 2C:
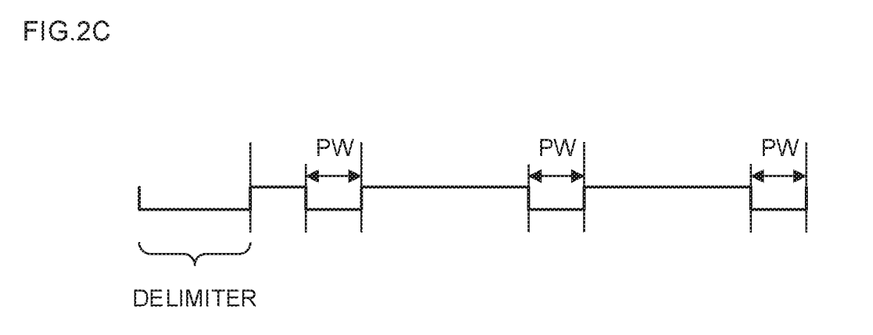
FIG. 2C is a diagram showing a binary level waveform of a preamble including a delimiter.

The binary level waveform generated by the data slicer 12 is used to detect a preamble indicating a beginning of data reception. FIG. 2C is a diagram illustrating a binary level waveform in the preamble. The leading portion of the preamble includes a delimiter that is an L level section. Since it is necessary to detect a delimiter in order to start data reception, detection of the first L section by the data slicer 12 is extremely important processing for successful data reception.

Figure 3:
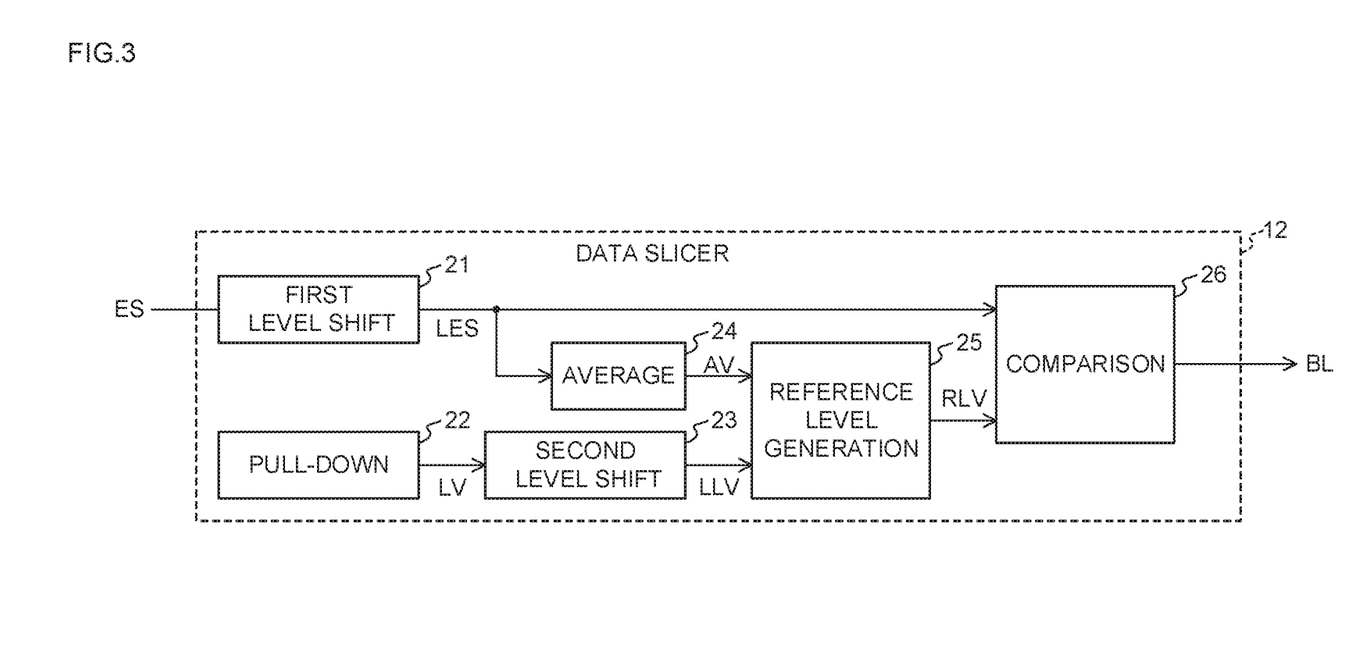
FIG. 3 is a block diagram showing a configuration of a data slicer of the first embodiment.

FIG. 3 is a block diagram showing the configuration of the data slicer 12. The data slicer 12 includes a first level shift circuit 21, a pull-down circuit 22, a second level shift circuit 23, an averaging circuit 24, a reference level generating circuit 25, and a comparison circuit 26.

The first level shift circuit 21 is a circuit for performing a level shift for changing the envelope signal ES to a DC level suitable for the circuit operation of the averaging circuit 24 and the comparison circuit 26. The first level shift circuit 21 supplies a level-shifted envelope signal LES to the averaging circuit 24 and the comparison circuit 26.

Figure 4A:
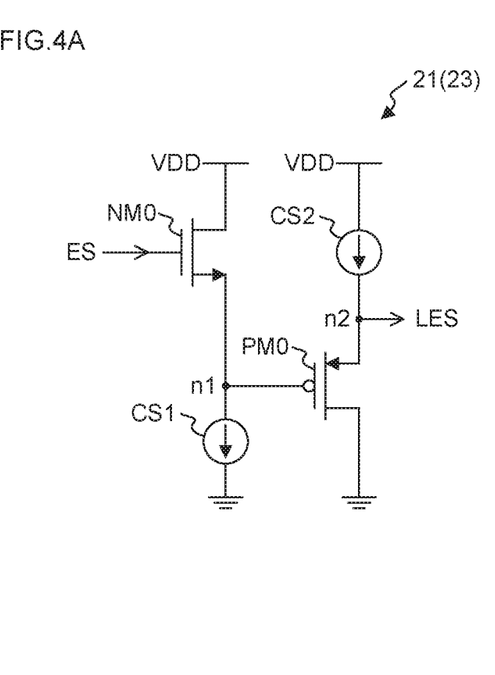
FIG. 4A is a circuit diagram showing a configuration of a DC level shift circuit of the first embodiment.

FIG. 4A is a circuit diagram showing an example of the configuration of the first level shift circuit 21. The first level shift circuit 21 includes a transistor PM0, a transistor NM0, and constant current sources CS1 and CS2.

The transistor PM0 is composed of a P-channel MOSFET (Metal Oxide Semiconductor Field Effect Transistor) which is a first conductivity type transistor. The transistor NM0 is composed of an N-channel MOSFET which is a second conductivity type transistor opposite to the first conductivity type.

The transistor NM0 has a source connected to a node n1 and a drain connected to a power supply (power supply potential VDD). Further, the transistor NM0 has a gate connected to the detector 11, and the gate receives the envelope signal ES.

The transistor PM0 has a drain grounded and a source connected to a node n2. Further, the transistor PM0 has a gate connected to the node n1.

The constant current source CS1 has one end connected to the node n1 and the other end grounded. The constant current source CS2 has one end connected to the power supply (power supply potential VDD) and the other end connected to the node n2.

As described above, the first level shift circuit 21 of FIG. 4A includes a combination of an NMOS source follower and a PMOS source follower. The envelope signal ES supplied to the gate of the transistor NM0 is level-shifted (that is, leveled down) in the direction in which the signal level is decreased by the transistor NM0, and then level-shifted in the direction in which the signal level is increased by the transistor PM0 (that is, leveled up), and is output from the node n2 as the level-shifted envelope signal LES.

Figure 4B:
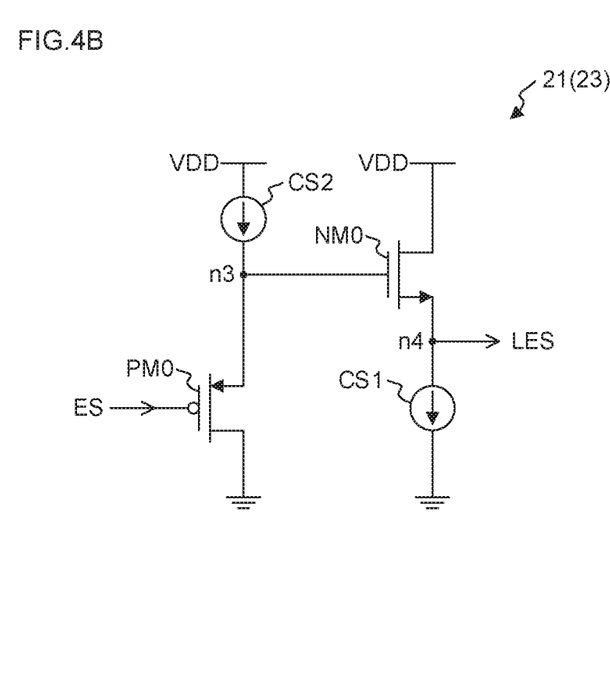
FIG. 4B is a circuit diagram showing another configuration of the DC level shift circuit of the first embodiment.

The configuration of the first level shift circuit 21 is not limited to that shown in FIG. 4A. For example, the positional relationship between the NMOS source follower and the PMOS source follower may be reversed. FIG. 4B is a circuit diagram showing another example of the configuration of the first level shift circuit 21.

The transistor PM0 has a drain grounded and a source connected to a node n3. Further, the transistor PM0 has a gate connected to the detector 11, and the gate receives the envelope signal ES. The transistor NM0 has a source connected to a node n4 and a drain connected to the power supply (power supply potential VDD). Further, the transistor NM0 has a gate connected to the node n3.

The constant current source CS1 has one end connected to the node n4 and the other end grounded. The constant current source CS2 has one end connected to the power supply (power supply potential VDD) and the other end connected to the node n3.

The envelope signal ES supplied to the gate of the transistor PM0 is level-shifted in the direction in which the signal level is increased by the transistor PM0 (that is, leveled up), and then level-shifted in the direction in which the signal level is decreased by the transistor NM0 (that is, leveled down), and is output from the node n4 as the level-shifted envelope signal LES.

Referring to FIG. 3 again, the pull-down circuit 22 generates, as an L level fixed value LV, a fixed voltage value corresponding to an L level of the envelope when it is assumed that the modulation degree of the ASK modulation of the RF signal transmitted from the reader/writer is 100%. That is, the pull-down circuit 22 generates the L level fixed value LV corresponding to the signal level output from the detector circuit 11 when no signal is output to the detector 11, and supplies it to the second level shift circuit 23.

In the first embodiment, since the receiver 100 is located in the passive RFID tag, when no signal is input to the detector 11, the signal level of the output signal from the detector 11 is 0V. Therefore, in the data slicer 12 of the first embodiment, the pull-down circuit 22 generates a voltage value of 0V as the L level fixed value LV and supplies it to the second level shift circuit 23.

The second level shift circuit 23 shifts the L level fixed value LV by the same DC level as the level shift of the envelope signal ES by the first level shift circuit 21. The second level shift circuit 23 supplies the L level fixed value LLV which is the level-shifted L level fixed value to the reference level generation circuit 25.

The second level shift circuit 23 has the same configuration as the first level shift circuit 21. That is, the second level shift circuit 23 has the circuit configuration shown in FIG. 4A or FIG. 4B, receives an L level fixed value LV of 0V instead of the envelope signal ES, and outputs an L level fixed value LLV which is the level-shifted L level fixed value instead of the level-shifted envelope signal LES.

Thus, the L level fixed value LLV is a fixed voltage value obtained by level shifting the L level fixed value LV, which is a fixed voltage value corresponding to the L level of the envelope. In other words, the second level shift circuit 23 of the first embodiment forms a fixed voltage value generation circuit that generates the L level fixed value LLV together with the pull-down circuit 22.

The averaging circuit 24 is a circuit that generates an average level AV obtained by time-averaging (that is, averaging per time) the level-shifted envelope signal LES supplied from the first level shift circuit 21. The averaging circuit 24 supplies the generated average level AV to the reference level generating unit 25.

Figure 5:
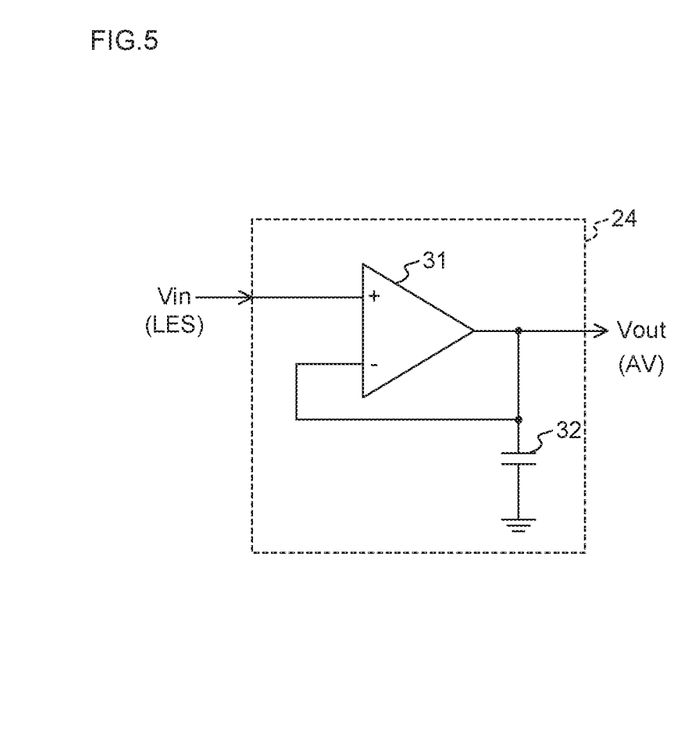
FIG. 5 is a circuit diagram showing a configuration of an averaging circuit of the first embodiment.

FIG. 5 is a circuit diagram showing a configuration of the averaging circuit 24. The averaging circuit 24 is configured by a combination of a voltage follower composed of an operational amplifier 31 and a capacitor 32.

The operational amplifier 31 has a non-inverting input terminal which receives the level-shifted envelope signal LES as an input voltage Vin. Further, the operational amplifier 31 has an inverting input terminal which is feedback-connected to the output terminal. One end of the capacitor 32 is connected to the inverting input terminal and the output terminal of the operational amplifier 31. The other end of the capacitor 32 is grounded.

Figure 6:
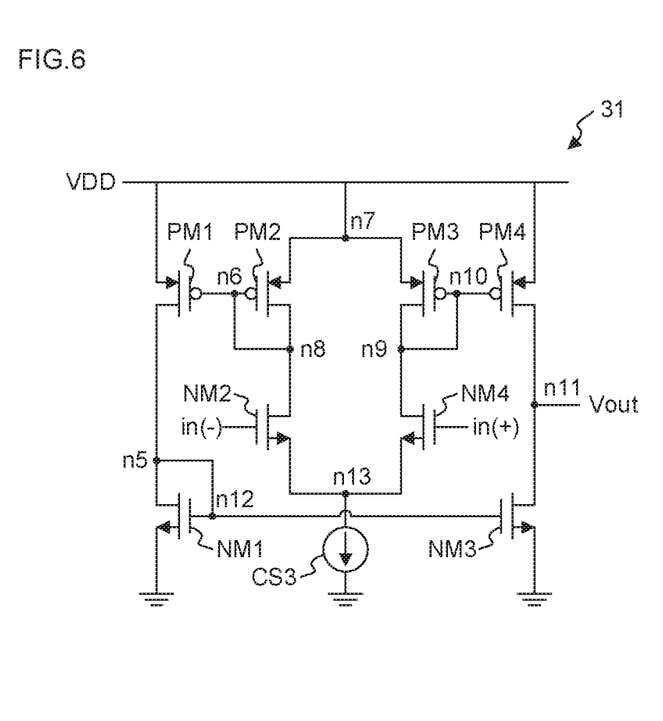
FIG. 6 is a circuit diagram showing a configuration of an operational amplifier in the averaging circuit of the first embodiment.

FIG. 6 is a circuit diagram showing a configuration of the operational amplifier 31. The operational amplifier 31 includes transistors PM1, PM2, PM3 and PM4 which are P-channel MOSFETs, transistors NM1, NM2, NM3 and NM4 which are N-channel MOSFETs, and a constant current source CS3.

The transistor PM1 has a source connected to the power supply (power supply potential VDD), a drain connected to a node n5, and a gate connected to a node n6. The transistor PM2 has a source connected to the power supply via a node n7, a drain connected to a node n8, and a gate connected to the gate of the transistor PM1 via the node n6. The drain and gate of the transistor PM2 are connected to each other via the nodes n8 and n6.

The transistor PM3 has a source connected to the power supply via the node n7, a drain connected to a node n9, and a gate connected to a node n10. The drain and gate of the transistor PM3 are connected to each other via the nodes n9 and n10. The transistor PM4 has a source connected to the power supply, a drain connected to a node n11, and a gate connected to the gate of the transistor PM3 via the node n10.

The transistor NM1 has a source grounded, a drain connected to the drain of the transistor PM1 via the node n5, and a gate connected to a node n12. The drain and gate of the transistor NM1 are connected to each other via the nodes n5 and n12.

The transistor NM2 has a source connected to one end of the constant current source CS3 via a node n13, and a drain connected to the drain of the transistor PM2 via the node n8. Further, the transistor NM2 has a gate connected to the one end of the capacitor 32 and the output terminal of the operational amplifier 31 which are shown in FIG. 5, to function as the inverting input terminal of the operational amplifier 31. The constant current source CS3 has one end connected to the node n13 and the other end grounded.

The transistor NM3 has a source grounded, a drain connected to the node n11, and a gate connected to the gate of the transistor NM1 via the node n12. The transistor NM4 has a source connected to the one end of the constant current source CS3 via the node n13, and a drain connected to the drain of the transistor PM3 via the node n9. Further, the transistor NM4 has a gate which receives the input voltage Vin (in the first embodiment, the level-shifted envelope signal LES) to function as the non-inverting input terminal of the operational amplifier 31.

The node n11 corresponds to the output terminal of the operational amplifier 31, and outputs, as an output voltage Vout, a signal obtained by averaging the input voltage Vin per time (that is, the average level AV of the level-shifted envelope signal LES in the first embodiment).

As shown in FIG. 2A, the envelope of the RF signal transmitted from the reader/writer has an H level duty which is high (that is, the H level period is relatively long). For this reason, the average of the envelope of the RF signal substantially corresponds to an H level (that is, a level slightly lower than the H level). Therefore, the average level AV having a level substantially close to the H level of the level-shifted envelope signal LES is supplied from the averaging circuit 24 to the reference level generation circuit 25.

Referring to FIG. 3 again, the reference level generation circuit 25 divides the average level AV supplied from the averaging circuit 24 and the level-shifted L level fixed value LLV supplied from the second level shift circuit 23 with a mixing ratio m:n, adds the divided values to each other, and supplies the added value to the comparison circuit 26 as a reference level RLV.

Figure 7A:
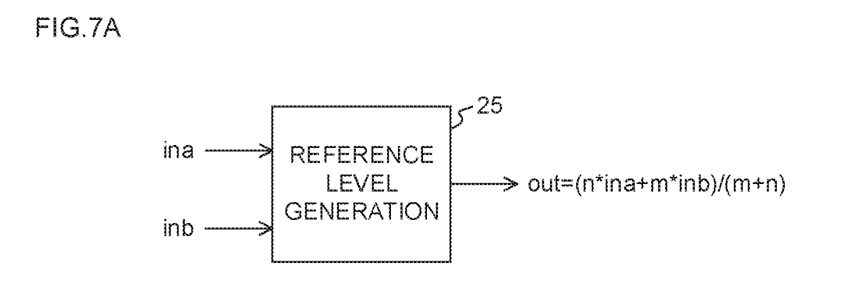
FIG. 7A is a block diagram showing inputs and an output of a reference level generation circuit of the first embodiment.

FIG. 7A is a block diagram showing inputs and an output of the reference level generation circuit 25. When the average level AV is equal to ina (AV=ina) and the level-shifted L level fixed value LLV is equal to inb (LLV=inb), the reference level generation circuit 25 outputs (n*ina+m*inb)/(m+n) as the reference level RLV.

The reference level RLV is preferably set to be higher than an intermediate level between the maximum value and the minimum value of the level-shifted envelope signal LES in preparation for the case where the modulation degree of the ASK modulation of the RF signal is shallow (that is, less than 100%). For example, by setting the mixing ratio to 2:3 or 1:2, it is possible to generate the reference level RLV which is higher than the intermediate level.

Figure 7B:
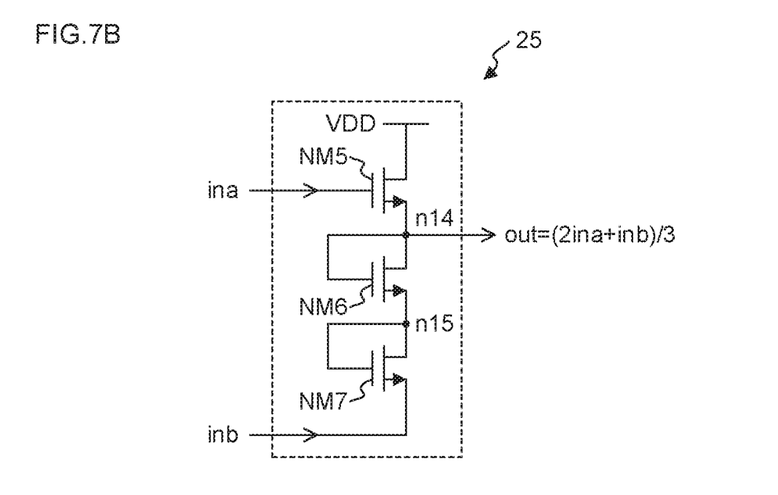
FIG. 7B is a circuit diagram showing an example of the reference level generation circuit of the first embodiment.

FIG. 7B is a circuit diagram showing an example of the configuration of the reference level generation circuit 25 when n=2 and m=1. The reference level generation circuit 25 is configured as a voltage division circuit including transistors NM5, NM6, and NM7, which are N-channel MOSFETs.

The transistor NM5 has a source connected to a node n14, a drain connected to the power supply (power supply potential VDD), and a gate supplied with ina (in the first embodiment, average level AV) which is one of a pair of input signals.

The transistor NM6 has a source connected to a node n15, a drain connected to the node n14, and a gate connected to the drain thereof via the node n14.

The transistor NM7 has a drain connected to the source of the transistor NM6 via the node n15, a gate connected to the drain thereof via the node n15, and a source supplied with inb (in the first embodiment, the level-shifted L level fixed value LLV) which is the other of the pair of input signals.

The node n14 corresponds to an output terminal of the reference level generation circuit 25, and an output signal out=(2*ina+inb)/3 obtained by dividing the input signals ina and inb with a mixing ratio of 2:1 is output as the reference level RLV.

Figure 7C:
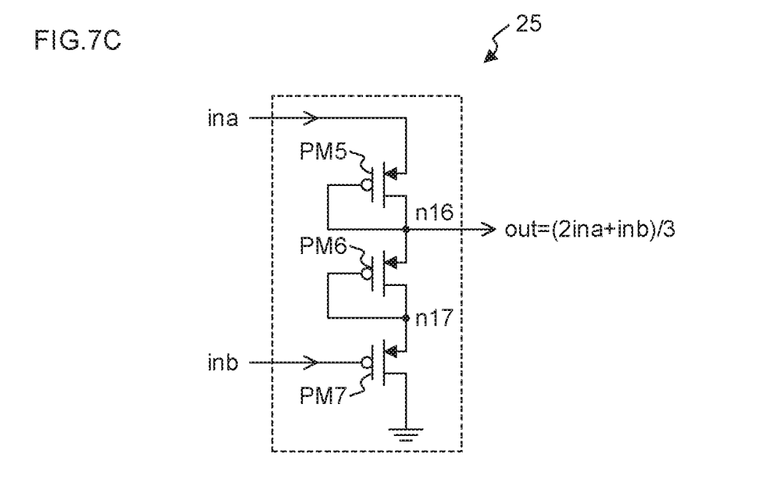
FIG. 7C is a circuit diagram showing another example of the reference level generation circuit of the first embodiment.

FIG. 7C is a circuit diagram showing another example of the configuration of the reference level generation circuit 25 when n=2 and m=1. The reference level generation circuit 25 is configured as a voltage division circuit including transistors PM5, PM6, and PM7, which are P-channel MOSFETs.

The transistor PM5 has a drain connected to a gate thereof via a node n16, and a source supplied with ina (average level AV in the first embodiment) which is one of the pair of input signals.

The transistor PM6 has a source connected to the node n16, and a drain and a gate which are connected to each other via a node n17.

The transistor PM7 has a source connected to the drain of the transistor PM6 via the node n17, a drain grounded, and a gate supplied with Inb (in the first embodiment, the level-shifted L level fixed value LLV) which is the other of the pair of input signals.

The node n16 corresponds to an output terminal of the reference level generation circuit 25. An output signal out=(2*ina+inb)/3 obtained by dividing and adding the input signals ina and inb with the mixing ratio of 2:1 is output as the reference level RLV from the node n16.

Referring to FIG. 3 again, the comparison circuit 26 compares the level-shifted envelope signal LES supplied from the first level shift circuit 21 with the reference level RLV supplied from the reference level generation circuit 25, and outputs a comparison result as a binary level signal BL.

Figure 8:
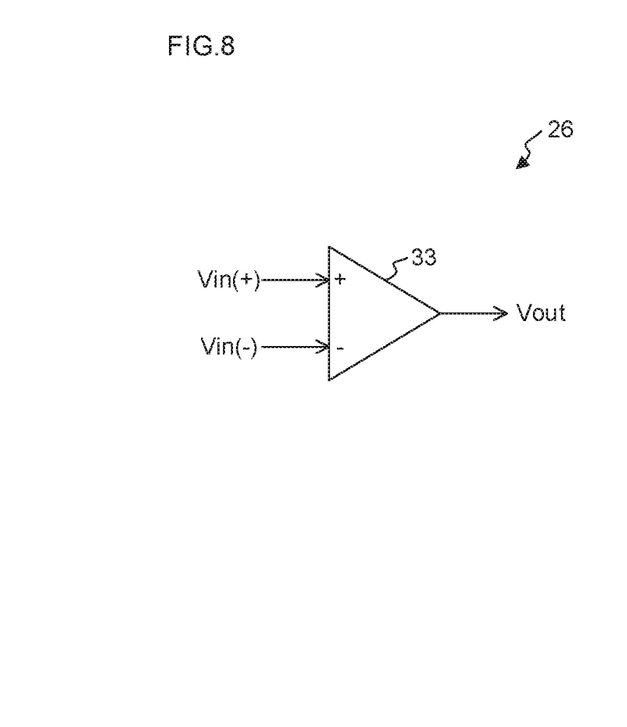
FIG. 8 is a block diagram showing inputs and an output of a comparison circuit of the first embodiment.

FIG. 8 is a block diagram showing inputs and an output of the comparison circuit 26. The comparison circuit 26 includes a comparator 33 that receives inputs of voltages Vin(+) and Vin(−) and outputs an output voltage Vout as a comparison result obtained by comparing them. In the first embodiment, the level-shifted envelope signal LES is input as the voltage Vin(+), the reference level RLV is input as the voltage Vin(−), and the binary level signal BL is output as the output voltage Vout.

Figure 9:
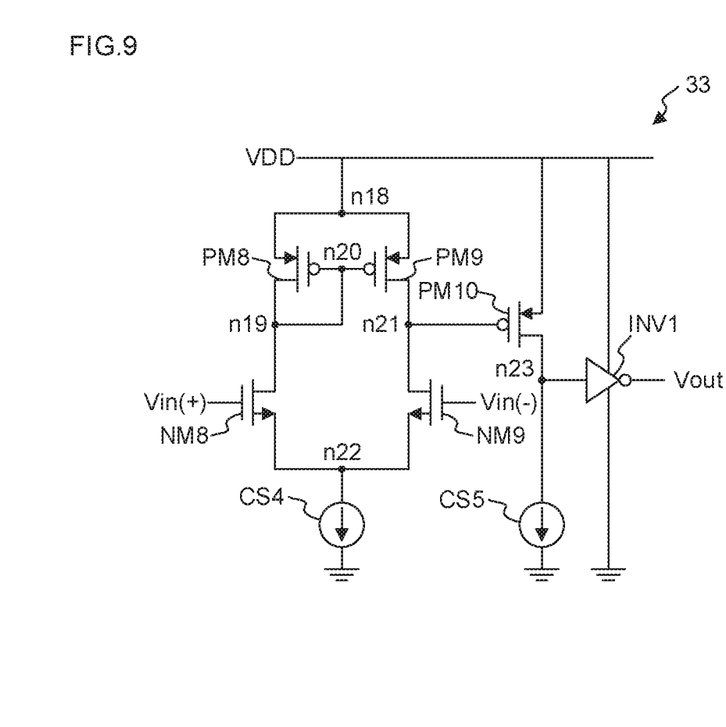
FIG. 9 is a circuit diagram showing a configuration of the comparison circuit of the first embodiment.

FIG. 9 is a circuit diagram showing an example of the configuration of the comparator 33. The comparator 33 includes transistors PM8, PM9, and PM10 that are P-channel MOSFETs, transistors NM8 and NM9 that are N-channel MOSFETs, constant current sources CS4 and CS5, and an inverter INV1.

The transistor PM8 has a source connected to the power supply (power supply potential VDD) via a node n18, a drain connected to a node n19, and a gate connected to a node n20. The drain and gate of the transistor PM8 are connected to each other via the nodes n19 and n20.

The transistor PM9 has a source connected to the power supply via the node n18, a gate connected to the gate of the transistor PM8 via the node n20, and a drain connected to a node n21.

The transistor NM8 has a source connected to one end of the constant current source CS4 via a node n22, a drain connected to the drain of the transistor PM8 via the node n19, a gate supplied with Vin(+) (in the first embodiment, the level-shifted envelope signal LES) which is one of the input voltages of the comparator 33.

The transistor NM9 has a source connected to the one end of the constant current source CS4 via the node n22, a drain connected to the drain of the transistor PM9 via the node n21, and a gate supplied with Vin(−) (in the first embodiment, the reference level RLV) which is the other input voltage of the comparator 33.

The transistor PM10 has a source connected to the power supply, a drain connected to a node n23, and a gate connected to the drain of the transistor PM9 and the drain of the transistor NM9 via the node n21.

The constant current source CS4 has the one end connected to the node n22 and the other end grounded. One end of the constant current source CS5 is connected to the drain of the transistor PM10 via the node n23, and the other end is grounded.

The inverter INV1 has an input terminal connected to the drain of the transistor PM10 and the one end of the constant current source CS5 via the node n23, and an output terminal from which a voltage obtained by inverting the voltage input to the input terminal is output as the output voltage Vout. In the first embodiment, the binary level signal BL, which is a comparison result obtained by comparing the level-shifted envelope signal LES and the reference level RLV, is output as the output voltage Vout.

Figure 10:
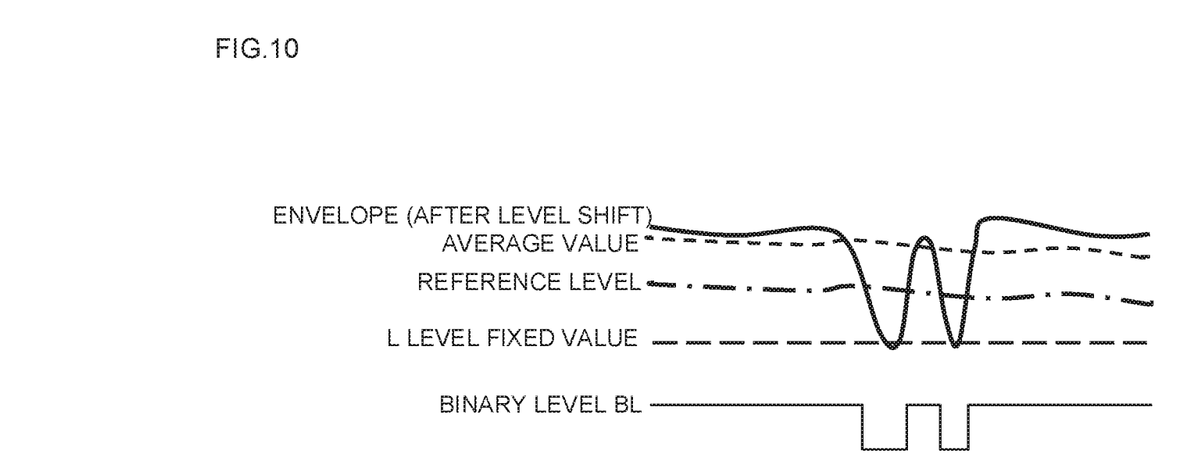
FIG. 10 is a waveform diagram showing operation of the data slicer of the first embodiment.

FIG. 10 is a waveform diagram showing operation of the data slicer 12 of the first embodiment. In the data slicer 12 of the first embodiment, the reference level generation circuit 25 generates the average level AV of the signal LES obtained by level-shifting the envelope signal ES obtained by envelope detection of the RF signal that is an amplitude-modulated wave, and generates the reference level RLV by dividing and adding the average level AV and the level-shifted L level fixed value LLV. Then, the comparison circuit 26 compares the level-shifted envelope signal LES with the reference level RLV, and generates the binary level signal BL indicating "H" when the signal LES level is higher than the reference level RLV and "L" when it is lower.

According to the data slicer 12 of the first embodiment, the mixing ratio of the reference level generation circuit 25 can be set in accordance with the modulation degree and so on of the ASK modulation of the RF signal to adjust the reference level RLV. For this reason, it is possible to avoid so-called chattering in which the signal level rises and falls above the reference level in the section that should be determined to be the same signal level. In addition, when a short H level section is included in the envelope, it is possible to avoid failing to capture it.

In particular, in the RFID, since the electric power for operating the RFID tag is rectified by the radio wave received from the reader/writer, the H level period of the envelope is long (that is, the H level duty is high). Accordingly, when the average level obtained by averaging the envelope per time is used as a reference as it is, the reference level is close to the H level, and chattering in which the output binary level frequently changes (or, toggles) between "H" and "L" occurs. However, according to the data slicer 12 of the first embodiment, such chattering can be avoided by setting the mixing ratio to appropriately obtain the reference level RLV.

Further, according to the data slicer 12 of the first embodiment, when the mixing ratio is set to m<n and the reference level RLV is set to be high, the modulation degree of the ASK modulation of the RF signal is shallow (that is, less than 100%). This will be described below.

Figure 11:
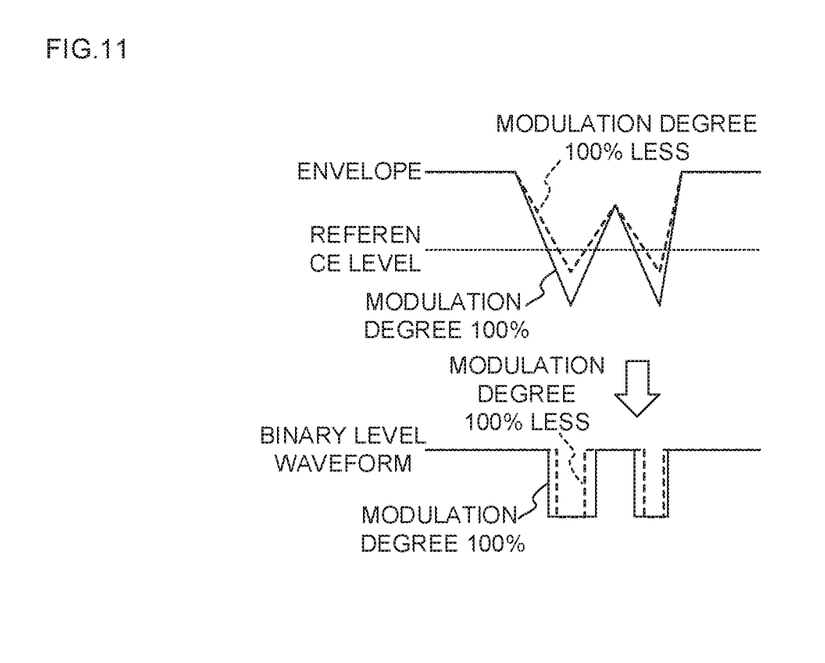
FIG. 11 is a diagram schematically showing a relationship between a reference level and a modulation degree.

FIG. 11 is a diagram schematically showing the relationship between the envelope and the reference level when the reference level is set low unlike the first embodiment and the modulation degree is each of 100% and 100% less. When the modulation degree is 100%, the binary level "L" section of a binary level waveform obtained by converting the envelope does not become very short even if the reference level is set to be somewhat low. On the other hand, when the modulation degree is less than 100% and shallow, as shown by the broken line in FIG. 11, since the level of the envelope does not decrease significantly, the "L" section of the binary level is shortened. If the "L" section is too short, the data determination circuit 13 provided at the subsequent stage of the data slicer 12 may not capture the "L" level for determining "0" or "1".

However, according to the data slicer 12 of the first embodiment, the reference level RLV can be set high by setting the mixing ratio of the reference level generation circuit 25 to become m<n. Thus, even when the modulation degree is less than 100%, it is possible to avoid failing to capture the "L" level in the subsequent data determination.

Further, the reference level generation circuit 25 according to the first embodiment generates the reference level RLV using the L level fixed value LLV that is a fixed voltage value. Therefore, since it is not necessary to previously capture the L level of the RF signal in order to generate the reference level RLV, it is possible to determine the first L level appearing in the preamble of the RF signal. In particular, in the RFID, when receiving an RF signal, it is necessary to detect the first L section called a delimiter. According to the data slicer 12 of the first embodiment, it is possible to avoid reception failure due to failing to detect the first L section.

Further, since the data slicer 12 of the first embodiment sets the reference level RLV using the average level AV of the envelope, the reference level RLV follows the change in the H level of the envelope. This is different from the case where the reference level is set using a so-called peak hold that holds the past maximum level of the envelope. Therefore, the binarization of the envelope can be performed while adapting the reference level RLV to a change in the H level of the envelope signal RS. In particular, in the RFID tag, since the H level of the envelope of the RF signal changes when the intensity of the received radio wave is unstable, the binarization can be performed with high accuracy by using the data slicer 12 of the first embodiment.

Further, as shown in FIGS. 7B and 7C, the reference level generation circuit 25 of the first embodiment includes the voltage dividing circuit composed of the transistors NM5, NM6, and NM7 that are N-channel MOSFETs, or of the transistor PM5, PM6, and PM7 that are P-channel MOSFETs. Instead of the first embodiment, when the reference level generation circuit is configured as a voltage dividing circuit using resistors, an operating current and a circuit area are in a trade-off relationship, and it is difficult that both a low operating current and a small area are compatible. When it is necessary to operate with limited electric power as in an RFID tag, the area is enlarged due to high resistance. On the other hand, since the reference level generation circuit 25 of the first embodiment is the voltage dividing circuit using MOSFETs, it is possible to simultaneously realize a low operating current and a small area.

Second Embodiment

Figure 12:
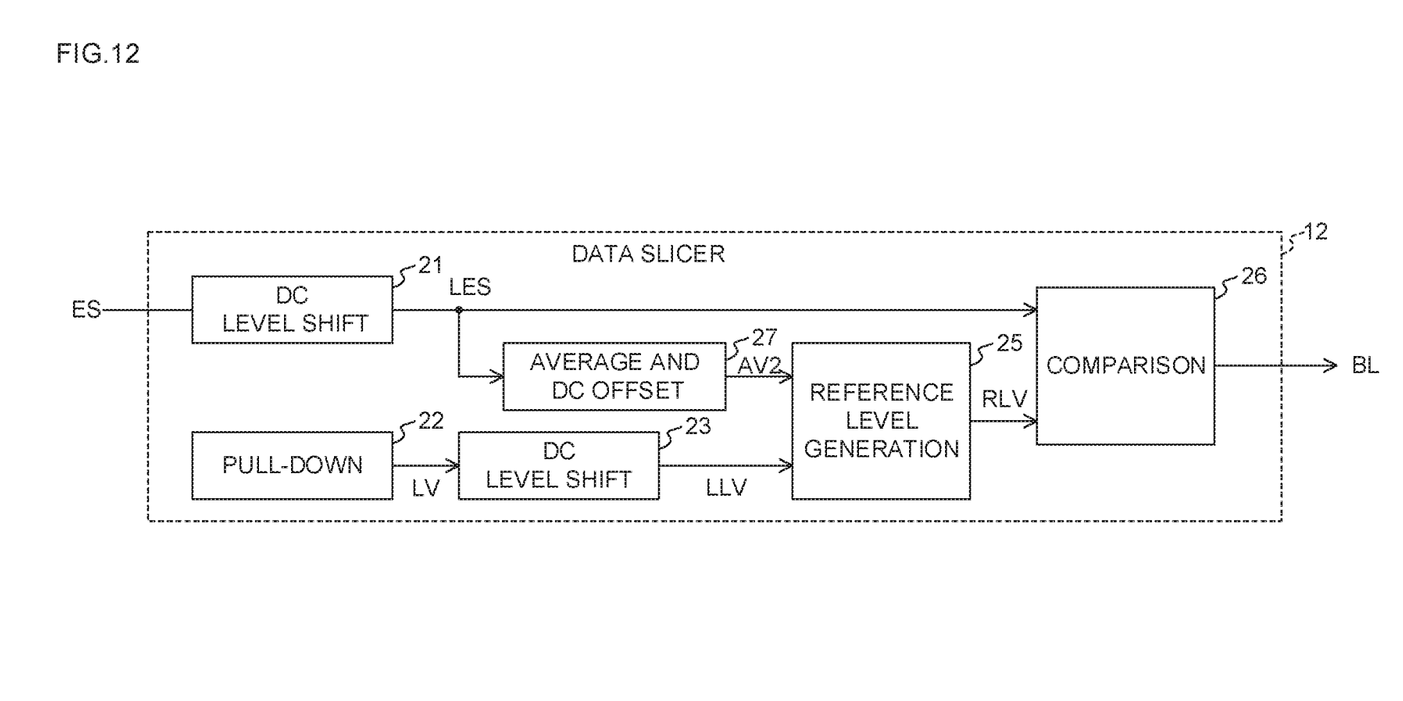
FIG. 12 is a block diagram showing a configuration of a data slicer of a second embodiment.

Next, a data slicer according to the second embodiment of the present invention will be described. FIG. 12 is a block diagram showing the configuration of the data slicer 12 of the second embodiment. The data slicer 12 of the second embodiment is different from the data slicer 12 of the first embodiment in that an average and DC offset circuit 27 is provided instead of the averaging circuit 24 of the first embodiment.

The average and DC offset circuit 27 is a circuit that time-averages the level-shifted envelope signal LES supplied from the first level shift circuit 21 and outputs an average level AV2 that is level-shifted by a predetermined DC offset. The average and DC offset circuit 27 supplies the generated average level AV2 to the reference level generation unit 25.

Figure 13:
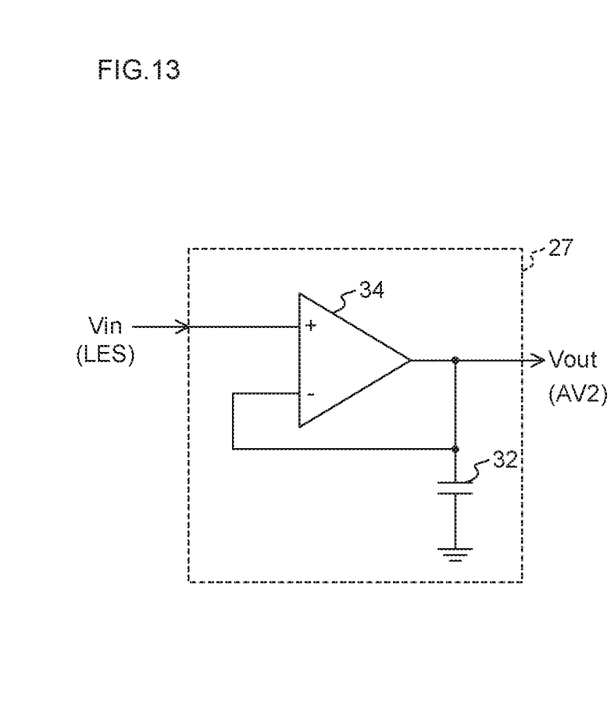
FIG. 13 is a circuit diagram showing a configuration of an averaging circuit of the second embodiment.

FIG. 13 is a block diagram showing a configuration of the average and DC offset circuit 27. The average and DC offset circuit 27 is configured by a combination of an operational amplifier 34 and a capacitor 32. The operational amplifier 34 is a voltage followers with a DC offset.

Figure 14:
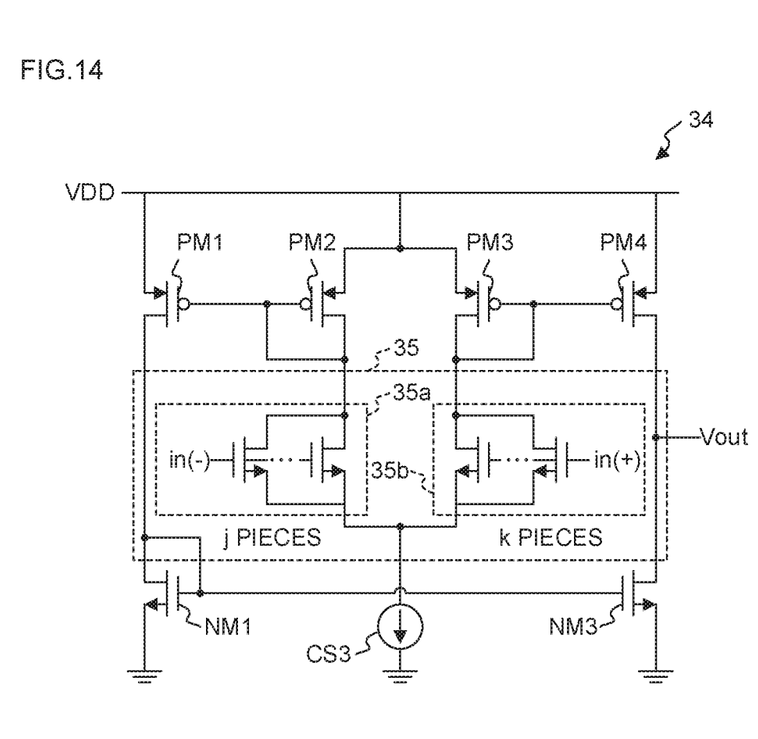
FIG. 14 is a circuit diagram showing a configuration of an operational amplifier in the averaging circuit of the second embodiment.

FIG. 14 is a circuit diagram showing a configuration of the operational amplifier 34. The operational amplifier 34 is different from the operational amplifier 31 of the first embodiment in that it includes a differential pair 35 including a plurality of transistors connected in parallel instead of the transistors NM2 and NM4 of the operational amplifier 31 of the first embodiment shown in FIG. 6.

The negative-side input part 35a of the differential pair 35 is configured by connecting j pieces of N-channel MOSFETs (j is an integer equal to or larger than 2) in parallel. On the other hand, the positive-side input part 35b of the differential pair 35 is configured by connecting k pieces of N-channel MOSFETs (k is not equal to j and is an integer equal to or larger than 2) in parallel. The negative-side input part 35a and the positive-side input part 35b of the differential pair 35 are configured by aligning the ratio (W/L) of the channel width (W) and the channel length (L) of the transistors constituting them.

In the operational amplifier 34 of the second embodiment, the offset is added by setting the parallel number j of the transistors of the negative-side input part 35a of the differential pair 35 and the parallel number of the transistors of the positive-side input part 35b to different values from each other. For example, when k>j, the number of parallel transistors in the positive-side input part 35b is larger than the number of parallel transistors in the negative-side input part 35a, so that the offset of +ΔV is added to an output voltage Vout. On the other hand, in the case of k<j, the number of parallel transistors of the negative-side input part 35a is larger than the number of parallel transistors of the positive-side input part 35b, so that the offset of −ΔV is added to the output voltage Vout. The output voltage Vout to which the offset is added is output from the average and DC offset circuit 27 as the average level AV2.

Referring to FIG. 12 again, the reference level generation circuit 25 divides the average level AV2 and the level-shifted L level fixed value LLV by a mixture ratio m:n, and adds the divided values to output the reference level RLV which is supplied to the comparison circuit 26. The comparison circuit 26 compares the level-shifted envelope signal LES supplied from the first level shift circuit 21 with the reference level RLV supplied from the reference level generation circuit 25, and outputs the comparison result as a binary level signal BL.

In the data slicer 12 of the second embodiment, the average and DC offset circuit 27 generates an average level V2 to which the offset is added. The reference level generation circuit 25 generates the reference level RLV using the average level V2. Therefore, the reference level RLV also becomes a value shifted by the amount of offset compared to the first embodiment.

According to the data slicer 12 of the second embodiment, it is possible to prevent chattering from occurring due to fluctuation of the envelope by noise or the like when the envelope has remained near the L level for a long time. This will be described below.

Figure 15A:
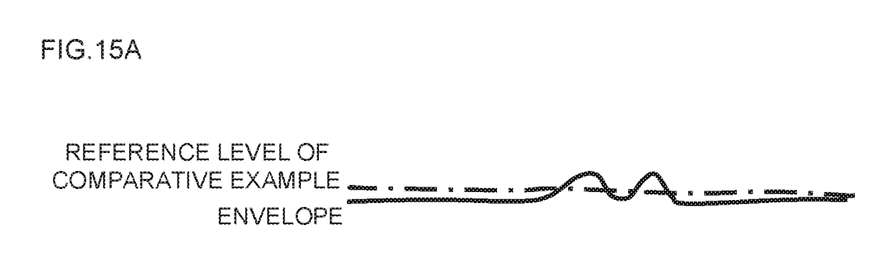
FIG. 15A is a waveform diagram showing occurrence of chattering due to noise in a comparative example different from that in the second embodiment.

Assuming that no offset is added to the time average of the envelope unlike the second embodiment, if the envelope changes near the L level for a long time, the time average also approaches the L level. When the time average approaches the L level, the reference level generated based on the divided values of the time average and the L level fixed value also becomes the L level. As a result, the envelope near the L level is compared with the reference level substantially equal to the L level. At this time, when the envelope that has been moving near the L level for a long time is shaken by noise, the signal level of the envelope and the reference level are frequently reversed as in the comparative example shown in FIG. 15A. Chattering in which the output binary level frequently changes (or, toggles) between "H" and "L" occurs.

Figure 15B:
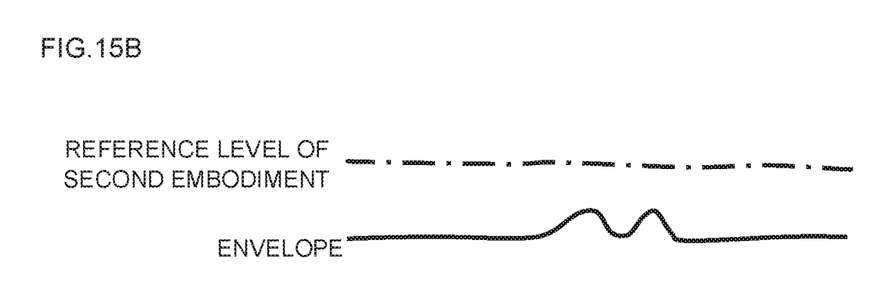
FIG. 15B is a waveform diagram showing that the chattering is suppressed by the averaging circuit of the second embodiment.

On the other hand, in the data slicer 12 of the second embodiment, the time average of the envelope is deviated from a state close to the L level by adding an offset. Thus, as shown in FIG. 15B, the reference level RLV generated by using the time average and the L level fixed value also deviates from the L level. By appropriately setting the deviation of the reference level from the L level, it is possible to prevent frequent reversal of the magnitude relationship between the envelope that fluctuates due to noise or the like and the reference level. Therefore, according to the data slicer 12 of the second embodiment, it is possible to suppress occurrence of chattering due to noise or the like in the binary level signal BL.

The present invention is not limited to the above embodiments. For example, as described in the above embodiments, the data slicer of each of the embodiments is useful as a data slicer for an RFID tag because stable reception can be expected. However, the data slicers of the embodiments can be applied to other receiving apparatuses other than the RFID tag. That is, the configurations of the data slicers of the embodiments can be used for all data slicers that convert an envelope signal obtained by envelope detection of an amplitude-modulated wave into a binary signal.

The configurations of the first level shift circuit 21 and the second level shift circuit 23 are not limited to those shown in the above embodiments. For example, in FIGS. 4A and 4B, the circuit configuration including the transistors NM0 and PM0 and performing level shift through level down and level up has been described. However, it may be configured to include only one of the transistors NM0 and PM0 and perform only one of the level down and the level up.

In the above-described embodiments, the case where the reference level generation circuit 25 is configured as a voltage dividing circuit including a plurality of MOSFETs connected in series has been described as an example. However, the present invention is not limited to this configuration, and may be configured as a voltage dividing circuit including other transistors. The reference level generation circuit 25 is preferably configured as a voltage dividing circuit composed of controlled current elements such as FETs.

In the first embodiment, the first level shift circuit 21 and the second level shift circuit 23 are provided in the data slicer. An envelope signal ES is level-shifted to generate an average level AV. The average level and a level-shifted L level fixed value LV are divided to generate a reference level RLV. However, the reference level RLV may be generated using the average level obtained by averaging the envelope signal ES per time as it is and an L level fixed value LV, without performing these level shifts. Similarly, in the second embodiment, the data slicer may be configured not to perform such level shifts.

This application is based on Japanese Application No. 2019-015127, which is incorporated herein by reference.

What is claimed is:

1. A data slicer for converting an envelope signal of an amplitude-modulated wave into a binary signal comprising:
an average level generation circuit configured to generate an average level of said envelope signal by averaging said envelope signal per time;
a fixed voltage value generation circuit configured to generate a fixed voltage value;
a reference level generation circuit configured to generate a reference level in accordance with said fixed voltage value and said average level of said envelope signal; and
a comparison circuit configured to compare a signal level of said envelope signal with said reference level to output a result of the comparison as said binary signal,
wherein said reference level generation circuit generates said reference level by dividing said average level of said envelope signal and said fixed voltage value with a ratio m:n (m and n are natural numbers which are different from each other).

2. The data slicer according to claim 1, wherein said reference level generation circuit is configured as a voltage dividing circuit including a plurality of FETs (Field Effect Transistors) connected in series, and generates said reference level by voltage-dividing said average level of said envelope signal and said fixed voltage value with said ratio m:n.

3. The data slicer according to claim 1, wherein said fixed voltage value is zero voltage.

4. The data slicer according to claim 1 further comprising:
a first level shift circuit configured to level-shift said envelope signal by a predetermined level; and
a second level shift circuit configured to level-shift said fixed voltage value by said predetermined level, wherein
said average level generation circuit generates said average level of said envelope signal by averaging the level-shifted envelope signal per time,
said reference level generation circuit generates said reference level in accordance with the level-shifted fixed voltage value and said average level of said envelope signal, and
said comparison circuit compares said level-shifted envelope signal with the generated reference level to output a result of the comparison as the binary signal.

5. The data slicer according to claim 1, wherein said average level generation circuit generates said average level of said envelope signal by adding an offset to the time-averaged envelope signal.

6. The data slicer according to claim 5, wherein said average level generation circuit includes a differential pair having a negative-side input part and a positive-side input part, said negative-side input part being configured by connecting j transistors (j is an integer equal to or larger than 2) in parallel, and said positive-side input part being configured by connecting k transistors (k is not equal to j and is an integer equal to or larger than 2) in parallel.

7. A receiver comprising:
an antenna unit configured to receive a wireless signal whose amplitude is modulated;
a detector configured to perform envelope detection to the received wireless signal to generate an envelope signal; and
a data slicer configured to convert said envelope signal into a binary signal; and
a demodulator configured to demodulate said wireless signal in accordance with said binary signal, wherein said data slicer includes:
an average level generation circuit configured to generate an average level of said envelope signal by averaging said envelope signal per time;
a fixed voltage value generation circuit configured to generate a fixed voltage value;
a reference level generation circuit configured to generate a reference level in accordance with said fixed voltage value and said average level of said envelope signal; and
a comparison circuit configured to compare a signal level of said envelope signal with said reference level to output a result of the comparison as the binary signal,
wherein said reference level generation circuit generates said reference level by dividing said average level of said envelope signal and said fixed voltage value with a ratio m:n (m and n are natural numbers which are different from each other).

* * * * *